United States Patent [19]

Matuszewski et al.

[11] Patent Number: 5,633,786
[45] Date of Patent: May 27, 1997

[54] SHIELD ASSEMBLY AND METHOD OF SHIELDING SUITABLE FOR USE IN A COMMUNICATION DEVICE

[75] Inventors: Scott W. Matuszewski, Lake Zurich; Jin W. Lee, Buffalo Grove; John F. Hannon, Gurnee; Martin J. Kimbell, Round Lake Beach, all of Ill.

[73] Assignee: Motorola, Schaumburg, Ill.

[21] Appl. No.: 517,496

[22] Filed: Aug. 21, 1995

[51] Int. Cl.⁶ .................................................. H05K 9/00
[52] U.S. Cl. .................... 361/818; 361/814; 361/816; 361/753; 361/796; 174/35 R; 174/35 GC; 174/35 TS
[58] Field of Search .................... 361/796, 816, 361/818, 814, 753, 800, 799; 174/35 R, 35 GC, 51, 35 TS; 307/89, 91; 330/68; 334/85; 257/728, 659, 660

[56] References Cited

U.S. PATENT DOCUMENTS

| | | | |
|---|---|---|---|
| 4,218,578 | 8/1980 | Olschewski et al. | 174/35 R |
| 4,829,432 | 5/1989 | Hershberger et al. | 361/818 |
| 4,890,199 | 12/1989 | Beutler | 361/818 |
| 5,014,160 | 5/1991 | McCoy, Jr. | 361/816 |
| 5,206,796 | 4/1993 | Thompson et al. | 361/818 |
| 5,323,299 | 6/1994 | Weber | 361/818 |
| 5,335,147 | 8/1994 | Weber | 361/818 |
| 5,436,802 | 7/1995 | Trahan et al. | 361/816 |

Primary Examiner—Leo P. Picard
Assistant Examiner—Anthony Dinkins
Attorney, Agent, or Firm—Rolland R. Hackbart

[57] ABSTRACT

A shielding assembly (102) for shielding an electronic circuit (108) disposed on a substrate (107) includes traces (118) and a shield (200). The traces (118) are disposed on the substrate (107) about the electronic circuit (108). The shield (200) includes leads (214, 218) for attachment to the traces (118). The shield (200) is attached to the traces (118) such that some of the leads (218), which are staggered, attach to the traces (118) in a nonconsecutive manner. An additional shield (201) including alternately staggered leads (222) can be adjacently attached to the previously attached shield (200). This is accomplished by attaching the alternately staggered leads (222) of the additional shield (201) to those traces that are between the traces attached to the previously attached shield (200).

20 Claims, 4 Drawing Sheets

SHIELD ASSEMBLY AND METHOD OF SHIELDING SUITABLE FOR USE IN A COMMUNICATION DEVICE

BACKGROUND OF THE INVENTION

1. Field of the Invention

The present invention relates generally to an electrical assembly and more particularly to an assembly for shielding an electronic circuit disposed on a substrate from interference.

2. Description of the Related Art

Modern electronic equipment includes electrical circuits mounted on a substrate that are sensitive to electromagnetic interference (EMI) and radio frequency interference(RFI) (collectively, interference). Interference may originate from internal sources within the electronic equipment or from external interference sources. Interference can cause degradation or complete loss of important signals, rendering the electronic equipment inefficient or inoperable.

To minimize interference, electrically conducting material is interposed between portions of the electrical circuit. For manufacturability purposes, this material is tooled into multiple enclosures or shields that conform to the electrical circuits. These shields are attached, typically via soldering, to grounded traces positioned both on the substrate and around the electrical circuits generating the interference as well as around the electrical circuits that are susceptible to interference. Oftentimes, the shields are attached in adjacency.

Techniques for adjacently attaching such shields include providing dual traces (a separate trace for each shield) and providing a single trace that is shared by both shields. However, dual traces consume an unacceptable amount of physical space. For example, assuming that each trace is 1.00 mm wide and each trace is separated by a 0.26 mm gap to ensure reliable attachment, dual traces require at least 2.26 mm of substrate area. Unfortunately, a single, shared trace has been found to be too unreliable. During attachment of the shields to a shared trace, such as the aforementioned 1.00 mm trace, the solder exhibits capillary attraction and migrates from the trace onto one or both shields. This leaves an insufficient amount of solder at the trace-shield interconnection thereby preventing reliable attachment. When sharing a trace as such the shields also tend to skew and even walk off the trace during attachment.

As portable electronic equipment becomes increasingly miniaturized and components of electrical circuits are placed closer together, the physical room available for shielding is greatly reduced. Therefore, what is needed is a shield assembly and a method of shielding that consumes as little space as possible and provides secure, reliable, and easily manufacturable interconnections.

DETAILED DESCRIPTION OF THE PREFERRED EMBODIMENTS

A shielding assembly for shielding an electronic circuit disposed on a substrate includes traces and a shield. The traces are disposed on the substrate about the electronic circuit. The shield includes leads for attachment to the traces. The shield is attached to the traces such that some of the leads, which are staggered, attach to the traces in a nonconsecutive manner. An additional shield including alternately staggered leads can be adjacently attached to the previously attached shield. This is accomplished by attaching the alternately staggered leads of the additional shield to those traces that are between the traces attached to the previously attached shield.

Figure 1:
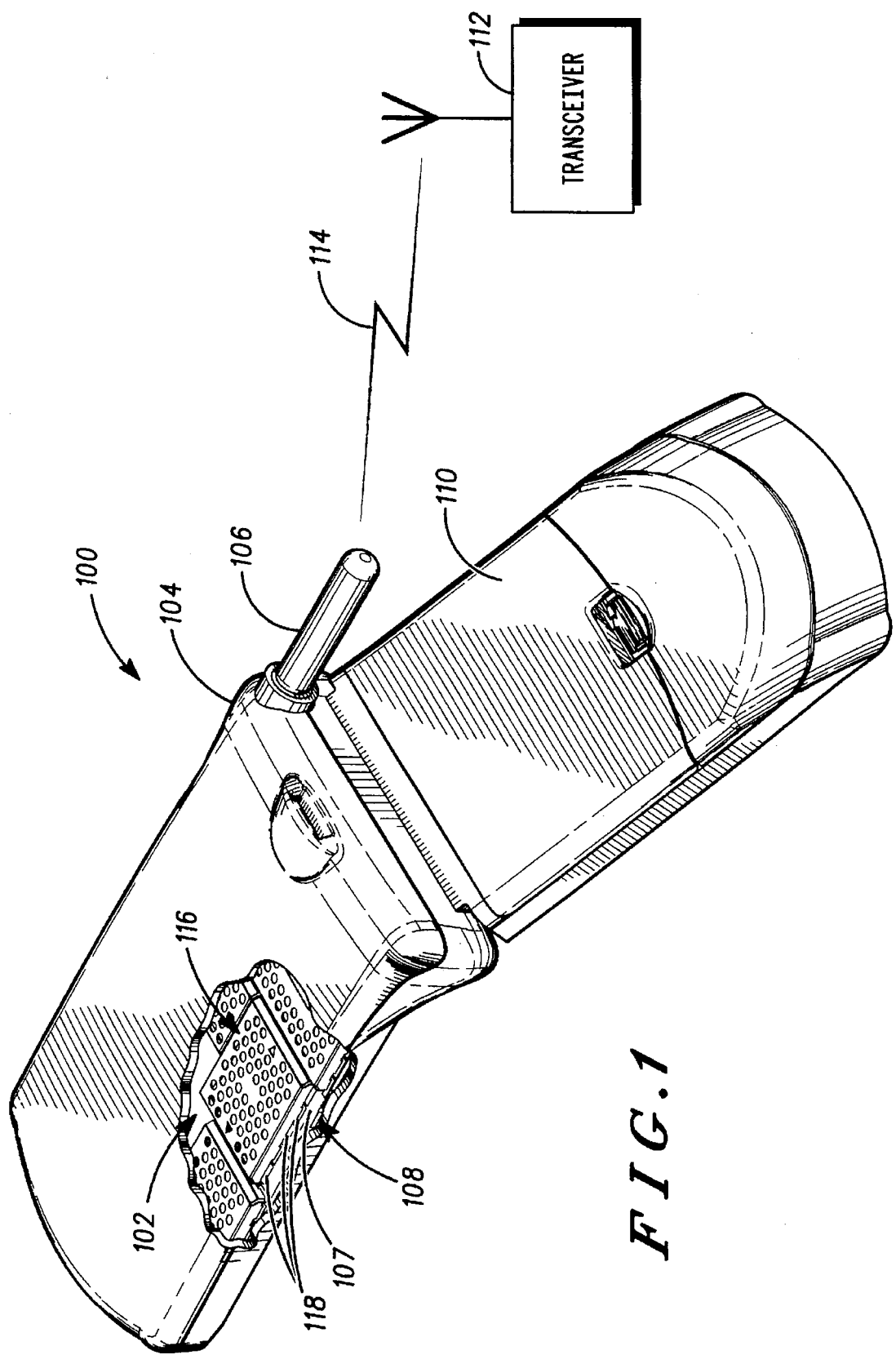
FIG. 1 illustrates a radio communication system including a portable electronic device employing a shielding assembly.

FIG. 1 illustrates a radio communication system including a portable electronic device, specifically a portable radiotelephone 100, employing a shielding assembly 102. The portable radiotelephone 100 includes a housing 104, an antenna 106 carried on the housing 104, a substrate 107 disposed within the housing 104, and a transceiver circuit 108 disposed on the substrate 107 beneath the shield assembly 102. A speaker (not shown), a microphone (not shown), a keypad (not shown), and a display (not shown) are disposed on a front side of the housing 104 that is hidden from view in FIG. 1. The portable radiotelephone 100 is powered by a detachable battery 110 attached to the housing 104.

The portable radiotelephone 100 operates in a radiotelephone communication system by communicating with a fixed site transceiver 112 via radio frequency (RF) signals 114. The fixed site transceiver 112 transmits the RF signals 114 into a radio coverage area populated by the portable radiotelephone 100. The antenna 106 transduces the RF signals 114 into electrical RF receive signals and couples the electrical RF receive signals to the transceiver circuit 108. The transceiver circuit 108 transforms the electrical RF receive signals into data receive signals which are then output to the user as audible speech via the speaker and as operational information via the display. Speech and data input by the user via the keypad and the microphone, respectively, is coupled to the transceiver circuit 108 as data transmit signals. The transceiver circuit 108 converts the data transmit signals into electrical RF transmit signals which are transduced by the antenna 106 and transmitted to the fixed site transceiver 112 as the RF signals 114.

The shielding assembly 102, which is only partially shown in FIG. 1, includes a plurality of shields 116 and a plurality of traces 118 disposed on the substrate 107. The plurality of shields 116 are electrically connected to the plurality of traces 118 to substantially enclose the transceiver circuit 108. The shielding assembly 102 prevents interference, such as electromagnetic interference (EMI) and radio frequency interference (RFI), from radiating beyond or penetrating through the plurality of shields 116 and interfering with the operation of the transceiver circuit 108 by, for example, degrading the aforementioned electrical RF receive and transmit signals as well as the data receive and transmit signals.

Although illustrated in a portable radiotelephone, the shielding assembly 102 will also find application in virtually any electronic apparatus, including computers, cordless telephones, two-way radios, pagers, personal digital assistants, and the like.

Figure 2:
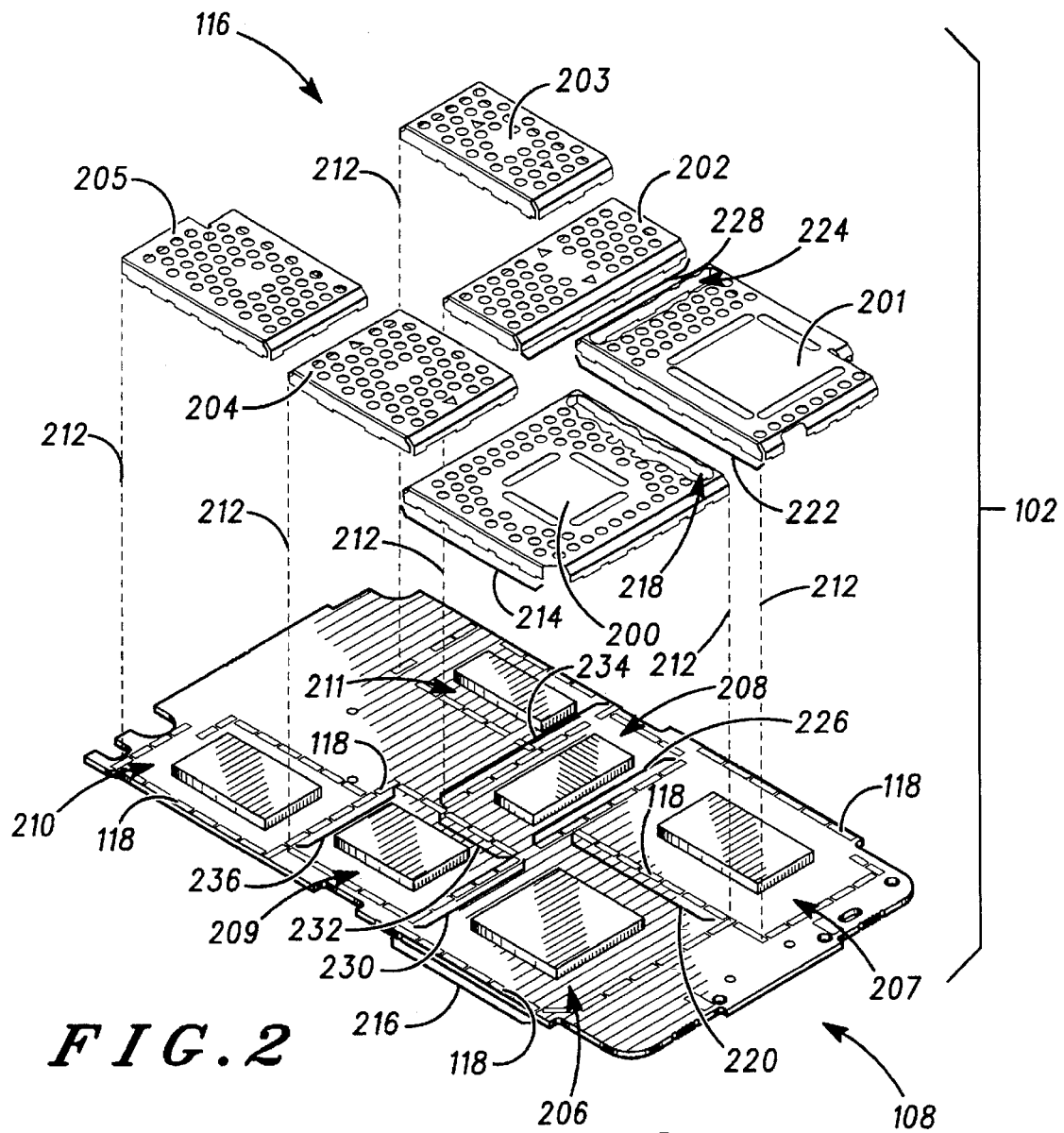
FIG. 2 illustrates an exploded perspective view of the shielding assembly of FIG. 1.

FIG. 2 illustrates an exploded perspective view of the shielding assembly 102 wherein the plurality of shields 116 are shown detached from, and projected above, the plurality of traces 118. In a preferred embodiment, the shield assembly 102 includes shields 200–205. Each one of shields 200–205 includes a planar top surface and substantially orthogonal side portions that extend downwardly therefrom and terminate in a bottom edge periphery. A plurality of leads extend downwardly from the bottom edge periphery in planarity with the side portions. The plurality of leads are located at predetermined locations about the bottom edge periphery beneath the side portions.

Shields 200–205 are preferably fabricated, using a known progressive stamping technique or a known slide tool technique, from a 0.05 mm to a 0.30 mm thick sheet of a nickel-silver alloy, a tin-plated steel, or other suitable material. The side portions are then folded into position based on the maximum height of the portion of the transceiver circuit 108 that is to be shielded. Depending on the type of components comprising this portion of the transceiver circuit 108, the height of the side portions might be less than 3.0 mm.

The plurality of traces 118 are arranged around the transceiver circuit 108 in rows. The length of the rows correspond to the dimensions of shields 200–205 and, specifically, to the lengths of their side portions. The plurality of rows extend both transversely and longitudinally on the substrate 107 and, in a preferred embodiment, partition the transceiver circuit 108 into circuit partitions 206–211. The circuit partitions 206–211 include a portion of the transceiver circuit 108, which might be, for example, an oscillator circuit, a microstrip transmission line, or a power amplifier circuit. Such partitioning increases manufacturability, eases repairability, and separates interference producing circuitry from sensitive circuitry.

The plurality of traces 118, which are preferably comprised of copper trace, are fabricated using known bonding and plating techniques during construction of the substrate 107, which preferably comprises printed circuit board material, such as polyimide or epoxybased flame retardant industrial fiberglass (G10-FR4). The plurality of traces 118 are electrically coupled to a ground plane (not shown). In the preferred embodiment, the plurality of traces 118 are 1.00 mm wide so as to ensure an effective metallurgical connection between the plurality of leads of shields 200–205 and the plurality of traces 118. It will be recognized, however, that this 1.00 mm width could be varied in accordance with, for example, variations in the thickness of the plurality of leads. Each of the plurality of traces 118 are preferably separated from one another by at least 0.26 mm of solder mask barrier or bare substrate material. The length of each one of the plurality of traces 118 is slightly larger then the length of the corresponding plurality of leads of shields 200–205.

The shield assembly 102 is preferably assembled via an automated assembly process. Initially, the substrate 107 is subjected to a screening process that deposits a predetermined amount of solder paste on the plurality of traces 118. To ensure secure attachment, the amount of solder (and the size of the plurality of traces 118) should be sufficient to allow solder to "wick" or adhere on both sides of each of the plurality of leads of shields 200–205 during reflow. In the preferred embodiment, the solder paste is a tin-lead-silver alloy.

Next, shields 200–205 are then lowered to enclose circuit partitions 206–211, respectively, as telegraphed by lines 212. The plurality of leads of shields 200–205 are positioned into engagement with the plurality of traces 118, preferably by an automated part placement machine. Unlike large one-piece shields that cover an entire substrate, shields 200–205 are manageably sized to allow automated placement by the same large part placement machine that might, for example, auto place a power amplifier or microprocessor. Upon positioning shield 200 to enclose circuit partition 206, a complete set of leads 214 of shield 200 engages all of corresponding ones of the plurality of traces 118 of row 216. Shield 200 also includes a first set of staggered leads 218 that are visible through a cut-away portion of the top surface of shield 200. The first set of staggered leads 218 are spaced apart and engage only approximately every other one, or nonconsecutive ones, of corresponding ones of the plurality of traces 118 of row 220.

Such nonconsecutive engagement permits shields 200–205 to share a common row when adjacently positioned. For example, upon positioning shield 201 to enclose circuit partition 207, shield 201 is adjacently positioned to shield 200 and includes a second set of staggered leads 222 that are spaced apart to engage the remaining unengaged ones of the plurality of traces 118 of row 220. Shield 201 includes a third set of staggered leads 224 that are visible through a cutaway portion of the top surface of shield 201. The third set of staggered leads 224 are spaced apart to engage only approximately every other one of corresponding ones of the plurality of traces 118 of row 226. Upon positioning shield 202 to enclose circuit partition 208, shield 202 is adjacently positioned to shield 201 and includes a fourth set of staggered leads 228 that are spaced apart to engage the remaining unengaged ones of the plurality of traces 118 of row 226. Similarly, shields 200 and 203 share row 230, shields 202 and 203 share row 232, shields 202 and 204 share row 234, and shields 203 and 205 share row 236.

After such engagement, the shield assembly 102 is reflow heated up to a temperature that is sufficient to melt the solder paste to a liquidus state. The liquidus solder wicks up on both sides of the single lead that occupies each one of the plurality of traces 118 and forms an effective metallurgical interconnection therebetween. In the preferred embodiment, the shield assembly 102 is reflow heated for approximately 660 s. During this time period, the temperature of the shield assembly 102 is increased to approximately 218° C.

Figure 3:
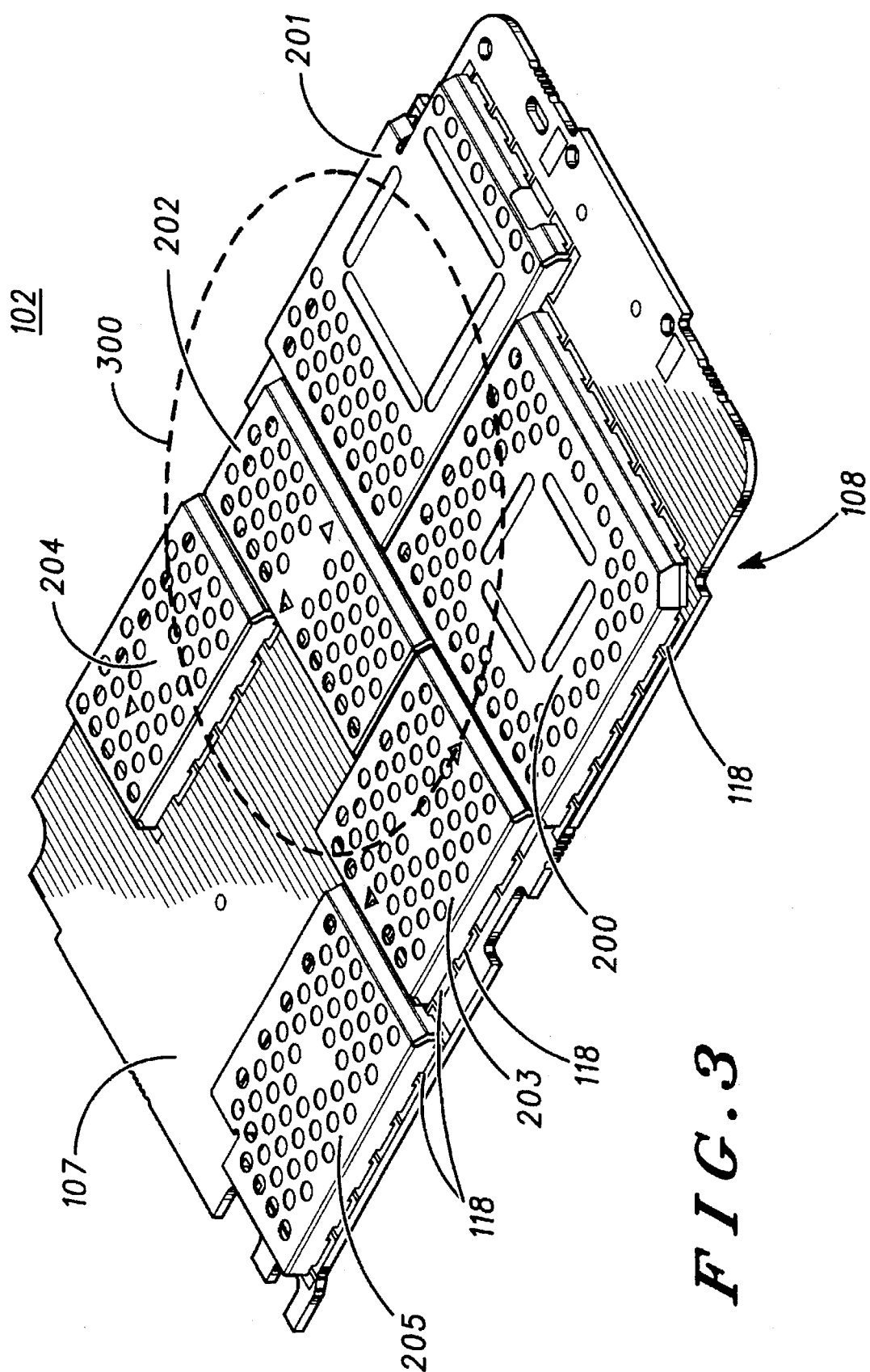
FIG. 3 illustrates a consolidated perspective view of the shielding assembly of FIG. 1.

The shielding assembly 102 is shown fully assembled in FIG. 3. Shields 200–205, which enclose circuit partitions 206–211, are grounded and conductive thereby preventing EMI and RFI from radiating therebeyond or from penetrating therethrough to interfere with the portions of the transceiver circuit 108 therebeneath. The plurality of leads of shields 200–205 and the plurality of traces are attached in one-to-one correspondence. Each one of the plurality of leads is isolated on its own trace. Shields 200–205 include a plurality of holes to permit visual inspection of the portions of the transceiver circuit 108 therebeneath. Such holes are sufficiently small enough (one-eighth wavelength or less at the highest frequency for which shielding is necessary) to prevent passage of interfering EFI or RFI. The size of the holes of shields 200–205 can be varied based on the sensitivity of the portion of the transceiver circuit 108 therebeneath. For more sensitive circuitry, the diameter of the holes are made smaller. Distal separations between the plurality of leads and openings between the bottom edge periphery of shields 200–205 and the skipped ones of the plurality of traces 118 are similarly constrained.

Figure 4:
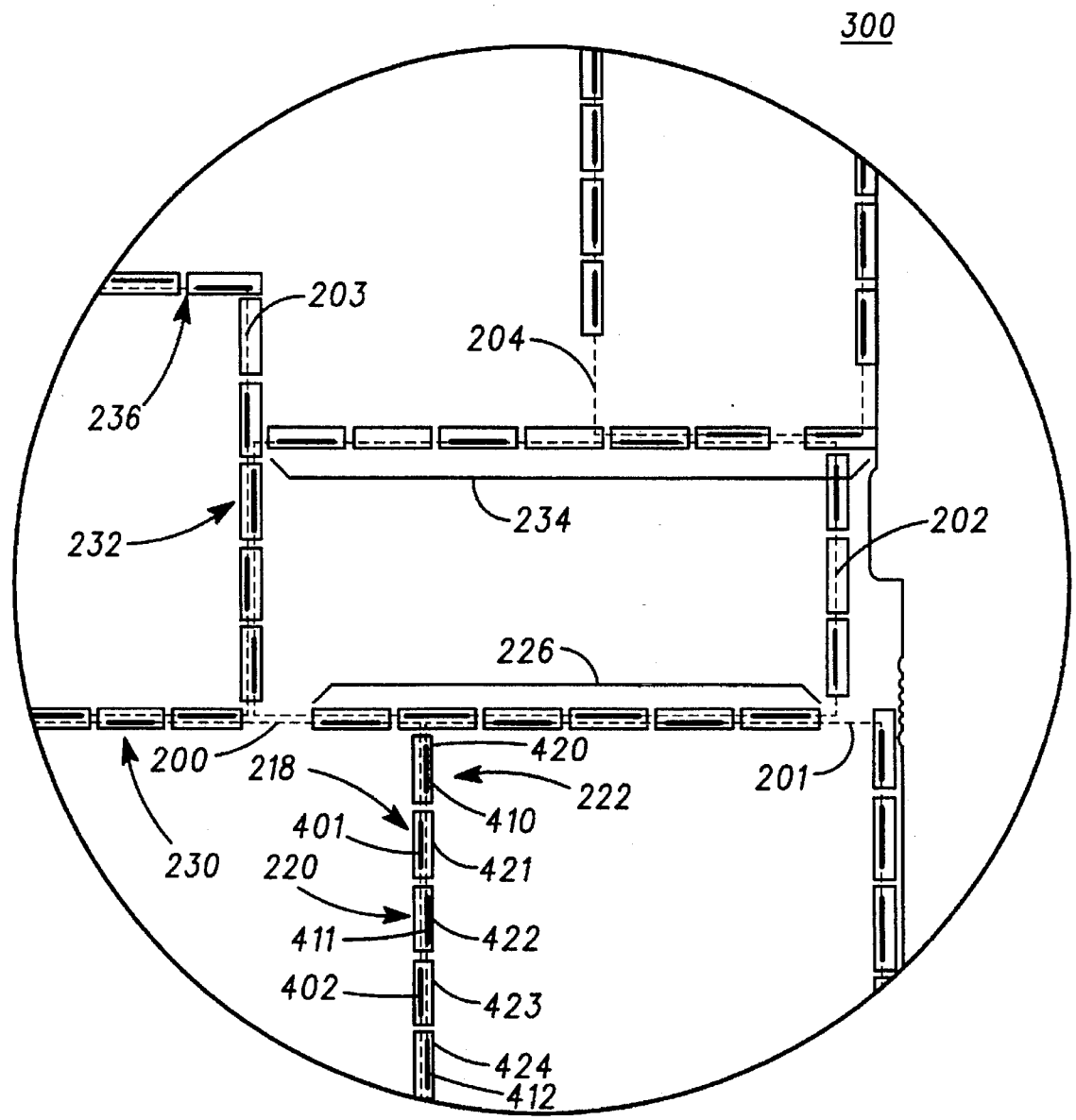
FIG. 4 illustrates an enlarged fragmentary plan view of the shielding assembly of FIG. 3.

The nonconsecutive engagement of a shared row of traces by the plurality of leads of two or more adjacent shields is clearly shown in FIG. 4, which shows an enlarged illustration of fragment 300 of the shielding assembly 102 of FIG. 3. For clarity, shields 200–204 are pictured in dotted line and the land pattern created by the plurality of leads are pictured in heavy line. Shields are positioned so that their adjacent side portions are offset from a center or a midline of the shared row. For example, shield 200 is positioned just to the left of the midline of row 220 and shield 201, which is adjacent thereto, is positioned just right of the midline of row 220. The plurality of staggered leads from each of the shields alternately engage the traces of the shared row in a staggered land pattern. For example, first and second leads 401,402 of the first set of staggered leads 218 of shield 200 engage second and fourth traces 421, 423 of row 220 just to the left of midline thereof. First, second, and third leads 410, 411, 412 of the second set of staggered leads 222 of shield 201 engage first, third, and fifth traces 420, 422, and 424 of row 220 just to the right of midline thereof.

Although illustrated as substantially rectangular with linear side portions, it will be recognized that shields 200–205 could be formed into other geometric shapes, such as circular or semi-circular shapes that include curvilinear side portions. Although the rows of the plurality of traces 118 are illustrated as straight lines, it will be recognized that the term "row" as used herein refers to "a single trace or multiple traces placed next to each other" and, thus, would include traces that are offset about a straight line and traces arranged in curvilinear patterns.

The shield assembly and method of shielding disclosed herein require only a single row of traces to effectuate attachment of adjacent shields. The adjacent shields are offset from the midline of the single row and include staggered leads that alternate attachment to the traces of the single row. The present shield assembly realizes more than a 50% reduction in the amount of substrate space that was previously required for shielding assemblies that required dual rows of traces to adjacently attach shields. The one-to-one correspondence between shield leads and traces of the present shield assembly, avoids field reliability and skewing problems prevalent in prior assemblies that attached adjacent shields to the same trace.

What is claimed is:

1. A shield assembly for shielding an electronic circuit disposed on a substrate, the shield assembly comprising:

a plurality of consecutive traces disposed on the substrate about the electronic circuit; and a first shield having a first plurality of consecutive leads for attachment to the plurality of consecutive traces, at least some of the first plurality of consecutive leads being attached to nonconsecutive ones of the plurality of consecutive traces.

2. A shield assembly according to claim 1 further comprising:

a second shield having a second plurality of consecutive leads for attachment to the plurality of consecutive traces, at least some of the second plurality of consecutive leads being attached to traces between the nonconsecutive ones of the plurality of consecutive traces.

3. A shield assembly according to claim 2 wherein the nonconsecutive ones of the plurality of consecutive traces and the traces between the nonconsecutive ones of the plurality of consecutive traces form a single row.

4. A shield assembly according to claim 3 wherein the nonconsecutive ones of the plurality of traces include every other trace of the single row.

5. A shield assembly according to claim 2 wherein the at least some of the first plurality of consecutive leads and the at least some of the second plurality of consecutive leads are staggered about a center of the nonconsecutive ones of the plurality of consecutive traces and the traces between the nonconsecutive ones of the plurality of consecutive traces.

6. A shield assembly according to claim 1 wherein the at least some of the first plurality of consecutive leads are offset from a center of the first set of nonconsecutive ones of the plurality of consecutive traces.

7. A shield assembly according to claim 1 wherein the first plurality of consecutive leads of the first shield are substantially orthogonal to the plurality of consecutive traces.

8. A shield assembly for shielding an electronic circuit disposed on a substrate, the shield assembly comprising:

a plurality of consecutive traces disposed on the substrate about the electronic circuit, at least some of the plurality of consecutive traces forming a row;

a first shield having at least a first edge, the at least a first edge including at least a first lead extending downward therefrom and attached to a first set of traces of the row; and a second shield having at least a second edge, the at least a second edge including at least a second lead extending downward therefrom and attached to a second set of traces of the row so that the at least a first edge of the first shield and the at least a second edge of the second shield are adjacent to one another.

9. A shield assembly according to claim 8 wherein the first set of traces of the row includes every other trace of the row.

10. A shield assembly according to claim 8 wherein the second set of traces of the row includes every other trace of the row.

11. A shield assembly according to claim 8 wherein the row consists of traces of the first set of traces alternated with traces of the second set of traces.

12. A shield assembly according to claim 8 wherein the at least a first lead and the at least a second lead extend substantially orthogonal from the at least some of the plurality of consecutive traces of the row.

13. A shield assembly according to claim 8 wherein the at least a first lead and the at least a second lead are staggered about the at least a first edge and the at least a second edge.

14. A shield assembly according to claim 8 wherein the at least a first lead and the at least a second lead are staggered about a center of the row.

15. A shield assembly for shielding an electronic circuit disposed on a substrate, the shield assembly comprising:

a plurality of consecutive traces disposed on the substrate for the electronic circuit, at least some of the plurality of consecutive traces arranged in a row; and a plurality of shields for shielding the electronic circuit, each one of the plurality of shields having a plurality of consecutive leads for attachment to the plurality of consecutive traces, at least some of the plurality of consecutive leads of a first one of the plurality of shields and at least some of the plurality of consecutive leads of a second one of the plurality of shields being staggered so as to attach to different ones of the at least some of the plurality of consecutive traces of the row when the first one of the plurality of shields and the second one of the plurality of shields are adjacently positioned.

16. A communication device having a housing, the communication device comprising:

a substrate disposed within the housing;

a transceiver circuit disposed on the substrate;

a plurality of consecutive traces disposed on the substrate about the transceiver circuit, at least some of the plurality of consecutive traces forming a row;

a first shield having at least a first edge, the at least a first edge including at least a first lead extending downward therefrom and attached to a first set of traces of the row offset a center thereof, the at least a first lead substantially orthogonal to the first set of traces of the row; and a second shield having at least a second edge, the at least a second edge including at least a second lead extending downward therefrom and attached to a second set of traces of the row offset a center thereof, the at least a second lead substantially orthogonal to the second set of traces of the row and substantially parallel to the at least a first lead, the second set of traces differing from the first set of traces, the at least a first edge of the first shield and the at least a second edge of the second shield being adjacent to one another.

17. A method of shielding an electronic circuit disposed on a substrate comprising the steps of:

providing a plurality of consecutive traces disposed on the substrate about the electronic circuit; and attaching a first shield having a first plurality of consecutive leads to the plurality of consecutive traces such that at least some of the first plurality of consecutive leads couple nonconsecutive ones of the plurality of consecutive traces.

18. A method of shielding according to claim 17 further comprising the step of:

attaching a second shield having a second plurality of consecutive leads to the plurality of consecutive traces such that at least some of the second plurality of consecutive leads attach traces between the nonconsecutive ones of the plurality of consecutive traces.

19. A method of shielding according to claim 17 wherein the step of attaching is preceded by the step of:

positioning the first shield upon the substrate such that the first plurality of consecutive leads rest upon the plurality of consecutive traces and the at least some of the first plurality of consecutive leads rest upon the nonconsecutive ones of the plurality of consecutive traces offset a center thereof.

20. A method of shielding according to claim 18 wherein the step of attaching is preceded by the step of:

positioning the second shield upon the substrate adjacent to the first shield such that the second plurality of consecutive leads rest upon the plurality of consecutive traces and the at least some of the second plurality of consecutive leads rest upon the traces between nonconsecutive ones of the plurality of consecutive traces offset a center thereof.

* * * * *